United States Patent
Pereira Da Cunha et al.

(10) Patent No.: US 9,048,807 B2
(45) Date of Patent: Jun. 2, 2015

(54) SURFACE ACOUSTIC WAVE RESONATOR WITH AN OPEN CIRCUIT GRATING FOR HIGH TEMPERATURE ENVIRONMENTS

(75) Inventors: Mauricio Pereira Da Cunha, Orono, ME (US); Bennet Meulendyk, Manchester, ME (US)

(73) Assignee: University of Maine System Board of Trustees, Bangor, ME (US)

( * ) Notice: Subject to any disclaimer, the term of this patent is extended or adjusted under 35 U.S.C. 154(b) by 780 days.

(21) Appl. No.: 13/050,389

(22) Filed: Mar. 17, 2011

(65) Prior Publication Data

US 2011/0278985 A1   Nov. 17, 2011

Related U.S. Application Data

(60) Provisional application No. 61/315,068, filed on Mar. 18, 2010.

(51) Int. Cl.
*H03H 9/25* (2006.01)
*H03H 9/145* (2006.01)
*H03H 9/02* (2006.01)

(52) U.S. Cl.
CPC .................. *H03H 9/02834* (2013.01)

(58) Field of Classification Search
CPC .......... H03H 9/02834; H03H 9/02637; H03H 9/02685; H03H 9/02724; H03H 9/02732
USPC .................. 333/189–195
See application file for complete search history.

(56) References Cited

U.S. PATENT DOCUMENTS

| | | | | |
|---|---|---|---|---|
| 4,144,507 A * | 3/1979 | Shreve | | 333/193 |
| 4,340,834 A * | 7/1982 | Sato | | 310/313 D |
| 5,061,871 A * | 10/1991 | Wright | | 310/313 B |
| 5,204,575 A * | 4/1993 | Kanda et al. | | 310/313 B |
| 5,287,036 A * | 2/1994 | Penunuri | | 310/313 R |
| 5,850,167 A * | 12/1998 | Abe | | 333/194 |
| 5,986,524 A * | 11/1999 | Shimoe | | 333/195 |
| 7,053,522 B1 * | 5/2006 | Pereira da Cunha | | 310/313 A |
| 7,105,980 B2 * | 9/2006 | Abbott et al. | | 310/313 A |
| 7,285,894 B1 * | 10/2007 | Pereira da Cunha | | 310/313 A |
| 7,888,842 B2 * | 2/2011 | Pereira da Cunha et al. | | 310/324 |
| 2007/0008052 A1 * | 1/2007 | Wada et al. | | 333/196 |
| 2014/0145557 A1 * | 5/2014 | Tanaka | | 310/313 D |

FOREIGN PATENT DOCUMENTS

| | | | | |
|---|---|---|---|---|
| EP | 1744451 A1 * | 1/2007 | | |
| JP | 2005198020 A * | 7/2005 | | H03H 9/145 |
| JP | 2007019710 A * | 1/2007 | | |

OTHER PUBLICATIONS

Meulendyk, B.J. and Pereira Da Cunha, M., Suppression of Transverse Waveguide Modes for SAW Resonators with Pt and Pt/Rh/ZrO2 Electrodes, IEEE (Institute of Electrical & Electronics Engineers), International Ultrasonics Symposium Proceedings, 2009, pp. 2810-2813.

* cited by examiner

*Primary Examiner* — Jaydi San Martin
(74) *Attorney, Agent, or Firm* — Choate, Hall & Stewart LLP

(57) ABSTRACT

Surface acoustic wave resonators for use in high temperature applications including a piezoelectric substrate, at least one interdigital transducer supported by the piezoelectric substrate, and a grating reflector supported by the piezoelectric substrate, the grating reflector being fabricated of a heavy metal and comprising a plurality of electrodes, at least one electrode of the plurality of electrodes being electrically isolated from at least one other electrode. Methods of making surface acoustic wave resonators are also included.

22 Claims, 9 Drawing Sheets

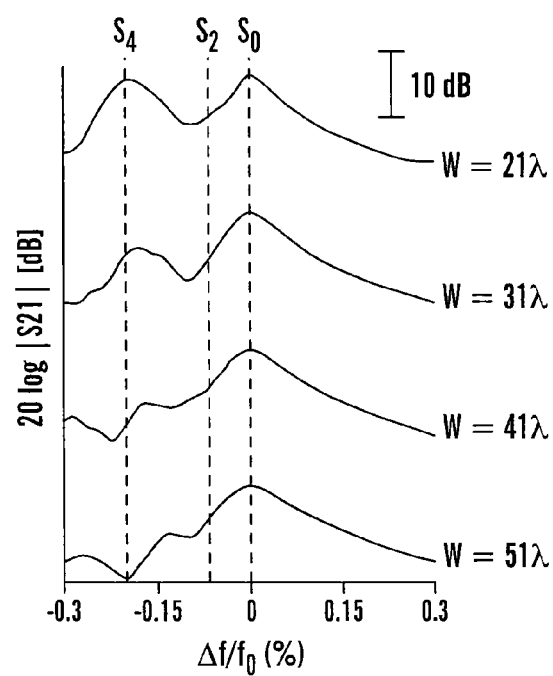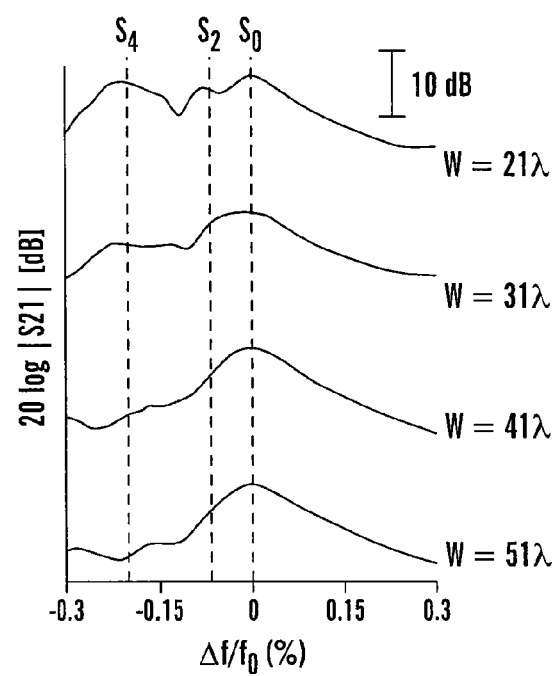
*FIG. 9A*  *FIG. 9B*

SURFACE ACOUSTIC WAVE RESONATOR WITH AN OPEN CIRCUIT GRATING FOR HIGH TEMPERATURE ENVIRONMENTS

CROSS REFERENCE TO RELATED APPLICATION

This application claims priority under 35 U.S.C. §119 to U.S. Provisional Application No. 61/315,068, filed Mar. 18, 2010, which is herein incorporated by reference in its entirety.

STATEMENT REGARDING FEDERALLY SPONSORED RESEARCH OR DEVELOPMENT

This invention was made with Government support under National Science Foundation (NSF) DGE-0504494 and Department of Defense Experimental Program to Stimulate Competitive Research (DEPSCoR) Grant No. FA9550-07-1-0519. The U.S. Government has certain rights in this invention.

TECHNICAL FIELD

The present invention generally relates to surface acoustic wave (SAW) resonators and in particular to SAW resonators for use in a high temperature environment.

BACKGROUND OF THE INVENTION

Piezoelectric substrates are capable of converting a physical stimulus such as pressure, acceleration, strain, or force into an electrical signal. In general, piezoelectric sensors show a proportional electrical output signal, relative to the applied force. Piezoelectric materials are used in several industries including the medical, aerospace and automotive industries.

One area where piezoelectric materials have been applied is in the area of surface acoustic wave resonator technology. Surface acoustic wave (SAW) resonators have been widely used in various industries, including the communications industry. A typical SAW resonator will consist of an electrode structure applied to a piezoelectric substrate. Materials such as aluminum and other lightweight metals are commonly used for the electrode material on SAW resonators.

Unfortunately, for high temperature applications, typical SAW resonators are unsatisfactory. This is due to several reasons including the relatively low melting temperature of the metal electrodes typically used in the art. Use of higher-melting temperature electrode materials has proven problematic because of various interference effects resulting from the use of these materials, including the generation of spurious modes.

SUMMARY OF THE INVENTION

The present invention includes, in a first aspect, a surface acoustic wave resonator for use in high temperature applications comprising a piezoelectric substrate, at least one interdigital transducer supported by the piezoelectric substrate, and one or more grating reflectors supported by the piezoelectric substrate, the grating reflector being fabricated of a heavy metal and comprising a plurality of electrodes, at least one electrode of the plurality of electrodes being electrically isolated from at least one other electrode.

The present invention includes, in a second aspect, a method of manufacturing an acoustic wave resonator for use in high temperature applications, the method comprising providing a piezoelectric substrate, associating at least one interdigital transducer with the piezoelectric substrate, and providing one or more grating reflectors that are supported by the piezoelectric substrate, the grating reflector being fabricated of a heavy metal and comprising a plurality of electrodes, at least one electrode of the plurality of electrodes being electrically isolated from at least one other electrode.

These, and other objects, features and advantages of this invention will become apparent from the following detailed description of the various aspects of the invention taken in conjunction with the accompanying drawings.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 9 illustrates a graph showing the magnitude responses of (a) 92.5 nm Pt resonators and (b) 120 nm Pt/Rh/ZrO$_2$ on LGS [0°, 144°, 24°], $W_0=55\lambda$. Top curve to bottom: $W=21\lambda$, $26\lambda, 31\lambda, 36\lambda, 41\lambda, 46\lambda, 51\lambda$. Absolute position on the ordinate is not preserved. Calculated dispersion from FIG. 8 at $W_0=55\lambda$, $S_0, S_2, S_4, S_6$: (a) $|\Delta f/f_0|=0\%$, 0.067%, 0.200%, (b) $|\Delta f/f_0|=0\%$, 0.065%, 0.195%.

DETAILED DESCRIPTION OF THE INVENTION

This invention relates to a surface acoustic wave resonator with an open circuit grating for operation at high temperature using non-conventional electrodes, such as platinum (Pt) and platinum-alloy electrodes. Aspects of the present invention are directed toward the design of improved surface acoustic wave (SAW) resonators for operation in high temperature environments. The advantages and improvements described in this invention allow these devices to operate in a variety of applications, for example, as frequency control components in several applications such as time or clock control for multiple electronic circuitry and also for high temperature sensor applications.

Figure 1:
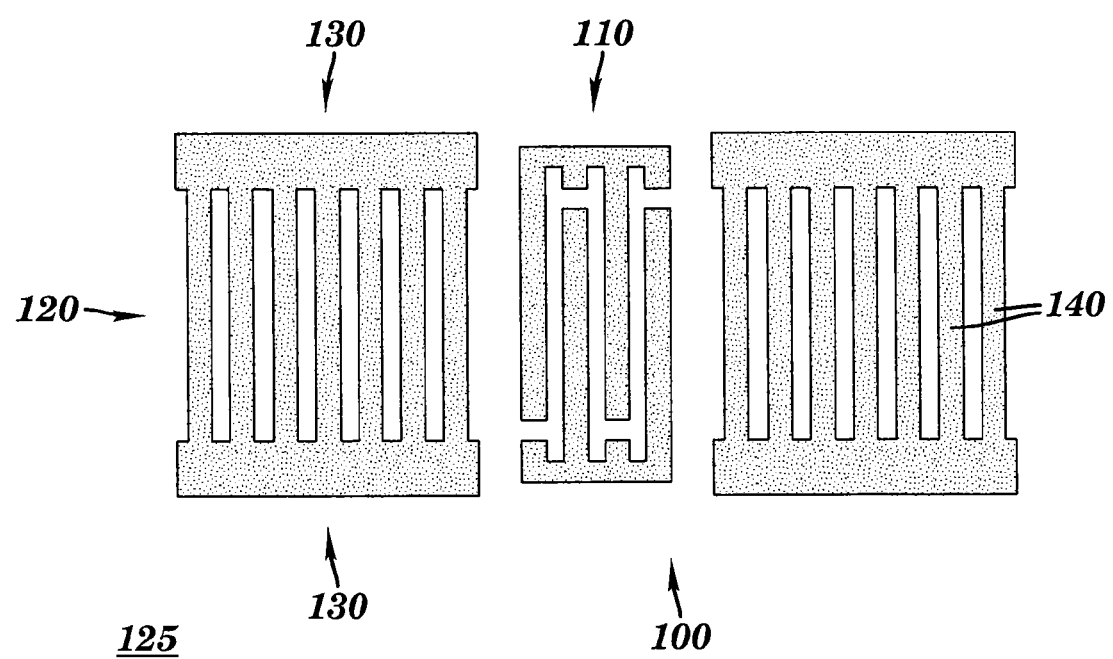
FIG. 1 depicts a plan view of one embodiment of a prior art short circuited grating resonator.

FIG. 1 shows an example of a prior art SAW resonator (100). The SAW resonator includes a single interdigital transducer (IDT) (110), a series of reflectors (120), for example parallel reflectors, on either side of the IDT (110), and two bus bars (130). Each of these structures is disposed on the surface of a substrate (125), for example, a piezoelectric substrate such as quartz. The series of reflectors (120) are comprised of a plurality of electrodes (140) shown with a mark-to-space ratio of approximately 1:1 and the area of the substrate over which the reflectors are disposed is sometimes referred to as a "half metalized region" due to the spaces between the reflectors.

SAW resonators with short circuit gratings, as depicted in FIG. 1, can be described, transversely, as having three distinct regions, each with a unique surface wave propagation velocity: the central, half metalized grating ($v_g$); the fully metalized bus-bars ($v_m$); and the outer, free-surface of the substrate ($v_0$). When the relation between the region velocities is given by: $v_g < v_n$, $< v_0$, the structure acts as a waveguide, confining the SAW to the central region.

Substrate/metal combinations also exist, for example when the metal is a heavy metal and when the substrate is a piezoelectric material, for which the relation between region velocities is given by: $v_m < v_g < v_0$. In such a case, a waveguide still exists, with a slow region (grating and bus-bars) bounded by fast regions (free-surface). However, a significant amount of acoustic energy leaks to and becomes trapped under the bus-bars, because they are bounded by the fast, free-surface region and the intermediate-velocity grating region. Since this energy will likely never return to the transducer, the insertion loss of the device response ultimately increases. It is interesting to note that the phenomenon mentioned does not seem to occur for conventional aluminum electrodes on top of quartz, lithium niobate, or lithium tantalate, which are the conventional electrode material and piezoelectric substrates used in the SAW technology. However, SAW resonators made from these materials are unsuitable for use under harsh conditions, such as high temperature conditions.

The electrode geometry of the prior art short circuited grating resonators, as shown in FIG. 1, is such that they trap acoustic energy and generate several spurious responses in the frequency response, thus seriously compromising the device performance as a frequency control component and sensor. In particular, when the surrounding temperature is varied, the existence of such spurious modes interfere with the major mode to be tracked, thus rendering the sensing mechanism and/or frequency tracking ineffective, since the tracking can jump between two or more distinct modes with different temperature behaviors.

In a first aspect, the present invention provides a surface acoustic wave resonator for use in high temperature applications comprising a piezoelectric substrate (125), at least one interdigital transducer (210) supported by the piezoelectric substrate, and one or more grating reflectors (220) supported by the piezoelectric substrate, the grating reflector being fabricated of a heavy metal and comprising a plurality of electrodes (240), at least one electrode of the plurality of electrodes being electrically isolated from at least one other electrode.

Figure 2A:
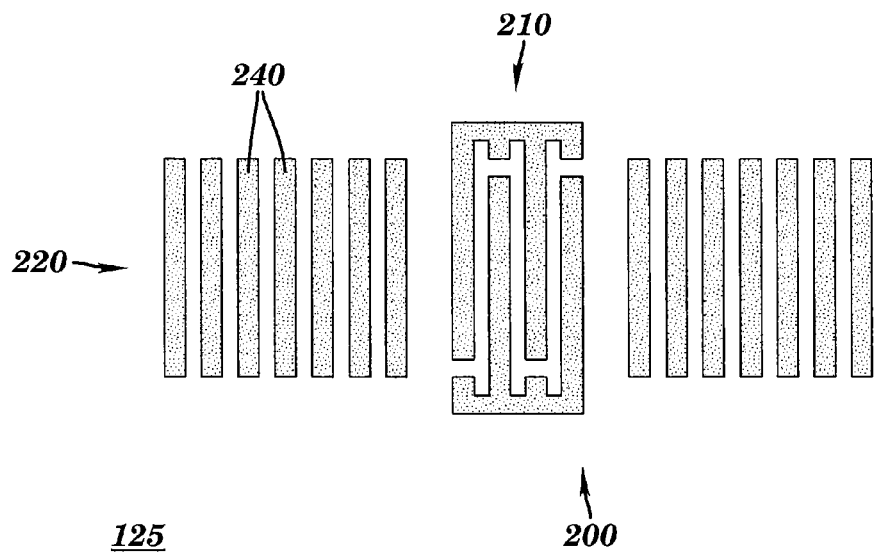
FIG. 2A illustrates a plan view of one embodiment of an open circuited resonator with a single interdigital transducer (IDT) in accordance with one or more aspects of the present invention.

FIG. 2A shows one example embodiment of a SAW resonator (200) according to this aspect of the invention. The embodiment shown in FIG. 2A has a single interdigital transducer (210), along with grating reflectors (220) disposed in axial alignment on either side of the IDT, all of which are disposed on the surface of a substrate (125). Each of the grating reflectors may comprise a plurality of heavy metal electrodes (240).

Figure 2B:
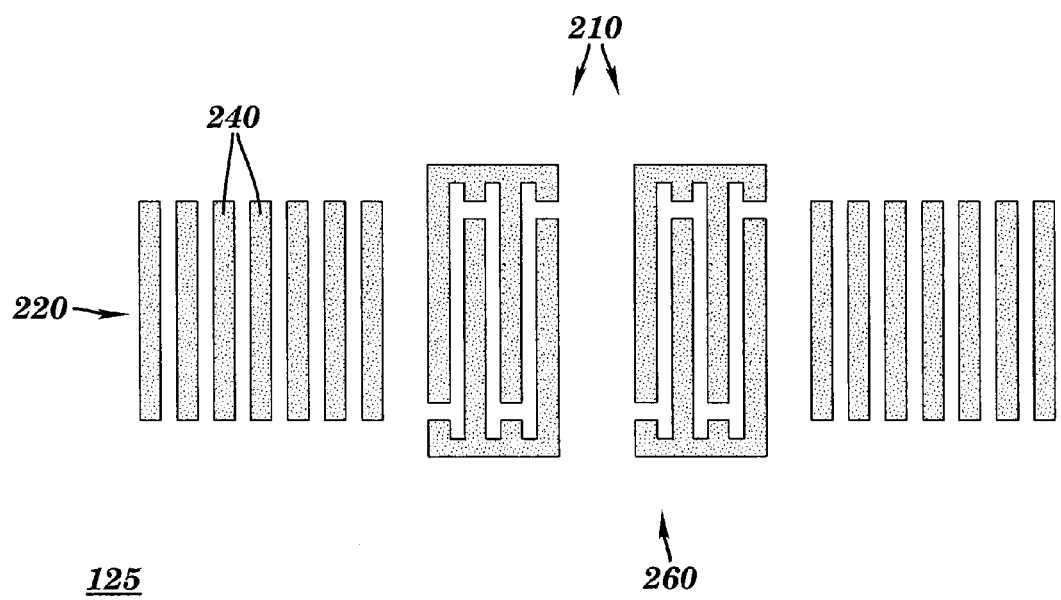
FIG. 2B illustrates a plan view of another embodiment of an open circuited resonator with two IDTs in accordance with one or more aspects of the present invention.

FIG. 2B shows another example embodiment of a SAW resonator (260) according to this aspect of the invention. The embodiment shown in FIG. 2B has two interdigital transducers (210), along with grating reflectors (220) disposed in axial alignment on either side of the IDTs, all of which are disposed on the surface of a substrate (125). Each of the grating reflectors may comprise a plurality of heavy metal electrodes (240).

A variety of IDT configurations may be used within the scope of the invention. The IDTs shown in FIGS. 2A and 2B are depicted as "floating" IDTs, meaning that the polarities of the IDT are not specified. The IDT polarities may be altered suit any intended application of the invention. The specific orientation of the IDT may vary according to the specific device design in which the present invention is incorporated, the thickness of the heavy metal electrodes used, and the selection of temperature compensated or temperature sensitive orientations, as well as selection of orientations which are sensitive to other target measurements, such as pressure or vibration. In addition an orientation might be selected to satisfy the criteria such as minimal diffraction and higher electrode reflectivity.

It will be appreciated that more than one IDT may be used in accordance with the present invention, for example, two IDTs as shown in FIG. 2B. When more than one IDT is used in a specific embodiment of the present invention, it is important to consider the placement and spacing and orientation of the IDTs relative to one another. If the IDTs are too close to one another, strong electromagnetic feedthrough may occur, which may interfere with certain applications of the present invention. The spacing between two or more IDTs should be determined through taking into account the potential for generation of spurious resonant modes, electromagnetic feedthrough, the size of the IDT used, the type and thickness of the metallic layer used, the substrate used, and the orientation of the substrate. Typically, it may be desired to position the IDTs such that they are synchronously positioned with respect to one another, meaning that the IDT electrodes are positioned so as to not disturb the standing wave pattern generated by the grating reflectors, and to maximize the quality factor, Q, of the resonator. For example, FIG. 2B shows an embodiment in accordance with the present invention which includes two IDTs with a space between them. The space is not necessarily to scale for any particular application and the space between IDTs would be specifically calculated for a particular substrate, heavy metal and application.

The piezoelectric substrate may be varied according to the specific application for which the invention is to be used. Non-limiting examples of suitable piezoelectric substrates for use within the scope of the invention include ST-X quartz, langasite, langatate, langanite, barium titanate, lithium niobate, lithium tantalate, lithium tetraborate, sodium tungstate, and gallium orthophosphate. It will be appreciated that some piezoelectric substrates may have anisotropic properties and proper orientation of the substrate will be required to prepare a functional SAW resonator. This disclosure will refer to specific Euler angles that have been found to be desirable orientations for the substrate in certain embodiments. Euler angles are typically shown as a series of intrinsic rotations from a particular frame of reference, for example, [0°, 144°, 24°]. It is important to note that the specific Euler angles shown are exemplary in nature for the examples described and are in no way limiting to the scope of the invention. It will be appreciated that optimal Euler angle for a particular application of the invention will vary according to methods known in the art.

The grating reflectors may take several forms according to different aspects of the invention. Typically, the grating reflectors will be comprised of heavy metal electrodes including electrodes made from a transition metal such as platinum, gold, zirconium, rhodium, tungsten, tantalum, nickel, copper, and silver, or a another heavy metal such as certain metalloids, lanthanides, and actinides. Alloys of certain heavy metals, for example, platinum or gold alloys may also be used within the scope of the present invention and may be advantageous for certain applications. Use of multiple co-deposited heavy metals such as in the platinum/rhodium/zirconium dioxide electrodes illustrated elsewhere in this disclosure, are also contemplated as within the scope of the invention.

The arrangement and connectivity of each electrode in the grating reflector may vary depending upon the specific application for which the present invention is to be used. While purely open circuit grating reflectors are shown in FIGS. 2A and 2B, other arrangements where some of the electrodes are connected to other electrodes are also possible, so long as the grating reflector is arranged in a partially open circuit arrangement.

The orientation of the grating reflectors may also vary in an application specific manner. FIGS. 2A and 2B show the grating reflector as a series of equal length, equal width, equally spaced heavy metal electrodes that are axially aligned, but other configurations are contemplated as within the scope of the present invention. Examples of acceptable alternate configurations include configurations wherein the length of each electrode is not equal, configurations wherein the spacing between electrodes is not equal to the width of each electrode (i.e. the mark-to-space ratio is not 1:1), and configurations wherein the width of each electrode is not equal.

Figure 3:
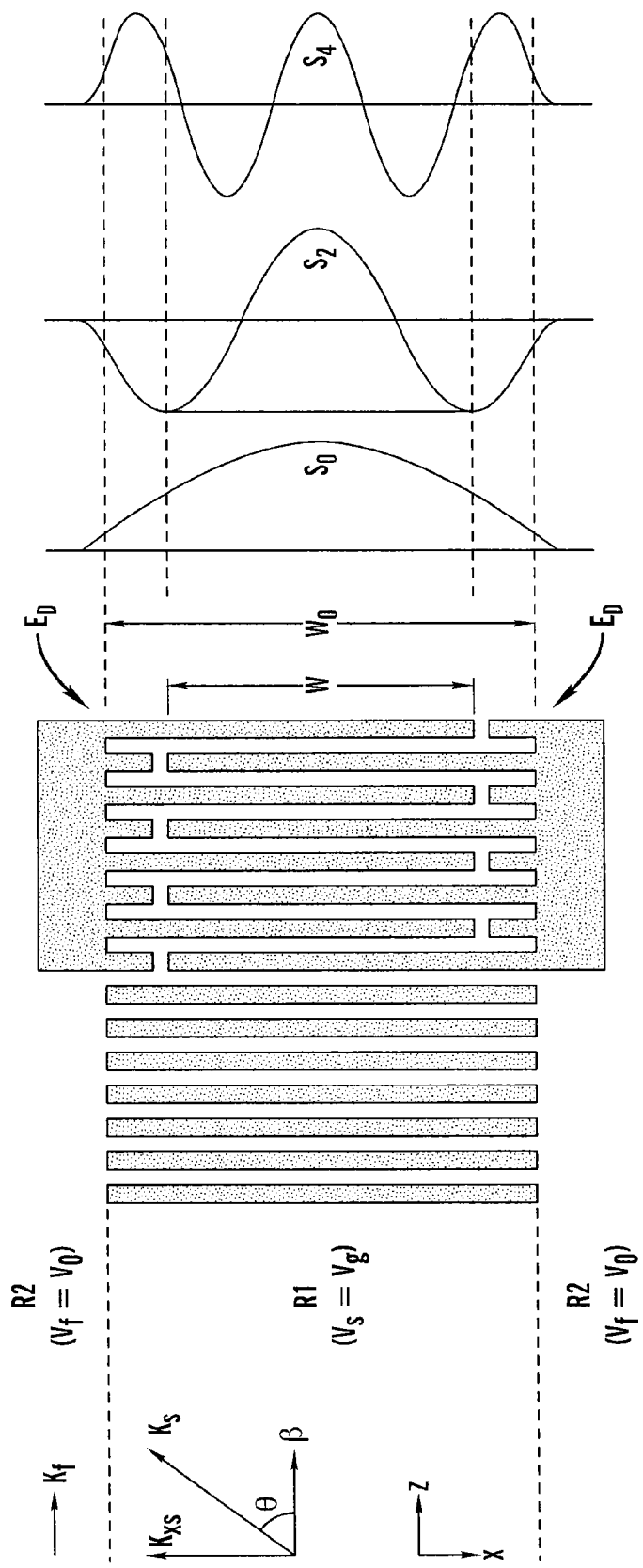
FIG. 3 shows a profile view of one embodiment of an open circuit resonator. Transverse regions are depicted on the left of the figure and scalar potential distributions of the first three symmetric modes are depicted on the right of the figure in accordance with one or more aspects of the present invention.

Alteration of the length of the reflectors may be used to allow for desired transverse waveguide mode suppression. FIG. 3 shows a relationship between total device aperture width $W_o$, and active area of the device W.

Transverse waveguide modes are supported across the aperture of an open circuit SAW resonator and can be analyzed by the scalar potential distribution of the fundamental mode, $S_0$, as well as symmetric modes $S_2$ and $S_4$. Modes of higher order than $S_0$ can be attenuated by adjusting the size of the active area, W, with respect to the total device aperture, $W_0$. As W decreases, the length of the dummy electrodes $E_D$ increase proportionally, to maintain a uniform grating velocity throughout the electrode region. FIG. 3 indicates that the scalar potential distribution of $S_2$ measured by the active area of the IDT will integrate to zero, filtering its effect from the frequency response of the resonator. For the same value of W, modes $S_2$ and $S_4$ will not simultaneously integrate to zero in the active area. Thus, this method optimally suppresses one transverse waveguide mode at a time. However, values of W may exist for which both modes $S_2$ and $S_4$ are adequately attenuated for the application.

The distance between the electrodes of the grating reflector may also vary according to a desired application of the invention. This distance is also referred to as the "mark-to-space" ratio and may vary between about 30/70 and about 70/30.

One of the applications for which the present invention is well suited is for use under high temperature conditions. For the purposes of this disclosure, high temperature conditions are defined as being approximately between about 300° C. and about 1,300° C.

The present invention includes, in a second aspect, a method of manufacturing an acoustic wave resonator for use in high temperature applications, the method comprising providing a piezoelectric substrate, associating at least one interdigital transducer with the piezoelectric substrate, and providing one or more grating reflectors that are supported by the piezoelectric substrate, the grating reflector being fabricated of a heavy metal and comprising a plurality of electrodes, at least one electrode of the plurality of electrodes being electrically isolated from at least one other electrode.

The piezoelectric substrate may be selected as described above for other aspects of the invention. For high temperature applications, it is important to select a substrate that will function under the expected conditions. Substrates such as ST-X quartz, langasite, langatate, langanite, and gallium orthophosphate may be particularly preferred under such circumstances. For many applications, one or more surfaces of the substrate may be optically polished, particularly if photolithographic methods will be used to configure the position and distribution of the grating reflectors.

The position and configuration of the grating reflector and IDT in a specific application may be selected and prepared using standard photolithographic techniques and typically performed in a clean room, according to procedures known in the art. A non-limiting example of a procedure for generating the grating reflectors shown in FIGS. 2A and 2B is as follows. First, a piezoelectric substrate capable of functioning under anticipated use conditions is provided and optically polished. Second, a photoresist layer is applied to at least one surface of the substrate. Application of the photoresist layer may be through any appropriate technique, including those known in the art, such as spin coating. Then, portions of the photoresist layer are exposed, typically using intensive light such as ultraviolet light, such that a desired pattern is generated in the photoresist layer. The specific result of the exposure step will differ according to whether a positive photoresist or a negative photoresist is used. For a positive photoresist, portions of the photoresist layer that are exposed to the light will become soluble in a basic developer. If a negative resist is used, the portions of the photoresist layer that are exposed to the light will become insoluble in a basic developer. Next, a developer is used to remove desired portions of the photoresist layer. Then, if using the known "lift off" technique, a heavy metal layer will be deposited over the entirety of the substrate/remaining photoresist surface. Then, a developer is used to remove desired portions of the photoresist layer and the metal which has been deposited on top of that portion of the photoresist, leaving only the heavy metal that was deposited directly onto the substrate. Typically, a post-exposure baking step will be employed to stabilize the resultant structure.

A variety of configurations of grating reflectors and IDTs are contemplated as within the scope of this aspect of the invention, including the variations discussed above.

Without wishing to be held to a particular theory, for the case where unique surface wave propagation velocity over the fully metalized bus-bars ($v_m$) is less than the surface wave propagation velocity over the grating reflectors ($v_g$), and $v_g$ is less than the surface wave propagation velocity over the outer, free-surface of the substrate ($v_0$), for example, when the metal electrodes are heavy metal electrodes disposed on a piezoelectric substrate, the present invention may significantly reduce the acoustic energy leaks found in prior art devices by eliminating the short circuit grating and replacing it with an open circuit grating, as depicted in FIGS. 2A and 2B. Removing the busbar altogether and creating a guiding structure consisting of two distinct transverse regions the slow velocity ($v_s$) grating region, and the fast velocity ($v_f$) free-surface region, provides an unexpected reduction in the acoustic energy leaks observed in prior art SAW resonators.

While a proper SAW waveguide structure confines acoustic energy to the central grating region, it is thought to do so by supporting a finite number of transverse waveguide modes that appear as spurious signals in a resonator's frequency response. Scalar potential theory is utilized to predict the frequencies at which these spurious modes occur. The SAW waveguide structure utilized for this calculation is depicted in FIG. 3, and is composed of a central, slow velocity, half-metalized region (R1), bounded by fast velocity, free-surface regions (R2).

The dispersion relation for this structure is:

$$\tfrac{1}{2}[W_0(k_s^2-\beta^2)^{1/2}]=m(\pi/2)+\tan^{-1}[(\beta^2-k_f^2)^{1/2}/(k_s^2-\beta^2)^{1/2}] \quad (1)$$

where $W_0$ is the aperture of the resonator, m is the integer transverse mode number, and the effect of the IDT bus bars is neglected. Since the resonator is symmetric in the transverse direction, only symmetric modes (m=0, 2, 4, 6, etc.) are supported. The propagation constants are defined as $\beta=\omega/v_p$, $k_s=\omega/v_s$, and $k_f=\omega/v_f$, where $v_p$, $v_s$, and $v_f$ are frequency dependent for metal thicknesses greater than zero. Furthermore, $k_s$ is a function of the propagation direction, $\theta$, approximated as, $$\theta \approx [(1-\beta v_s/\omega)/(\tfrac{1}{2}-\alpha)]^{1/2} \quad (2)$$

where $\alpha$ is a parabolic anisotropic factor. This factor approximates the velocity anisotropy near a pure mode axes with a second order polynomial.

For a particular substrate/metal combination, improvements in device performance must be addressed through resonator design. For instance, short circuit gratings using platinum (Pt) or Pt/rhodium (Rh)/zirconium dioxide ($ZrO_2$) on ST-X quartz and LGS [0°, 144°, 24°] leak energy from the active area into the bus bar, due to the velocity discontinuity between these two regions. It will be appreciated that other materials with Euler angles other than those shown above also may be utilized for resonators. This phenomenon increases response distortion and insertion loss, thus compromising the device performance.

Attenuating or eliminating spurious modes close to the resonant frequency also improves the Q-factor and insertion loss of a resonator. Transverse waveguide resonances can sometimes be eliminated by choosing s sufficiently small aperture of the device such that the modes are cut-off. However, this technique limits the design flexibility of the device and makes impedance matching difficult. Alternatively, suppression of transverse waveguide resonances can be accomplished through apodization of the interdigital transducer (IDT) in the transverse direction or by scaling the size of the IDT's active area and dummy electrodes.

EXAMPLES

Platinum (Pt)-electrode resonators on ST-cut, x-propagating (ST-X), or ST-cut, ninety-degree propagating)(ST-90° quartz, and Platinum/Rhodium/Zirconium-dioxide (Pt/Rh/$ZrO_2$)-electrode resonators on Langasite (LGS), Euler angles: [0°, 144°, 24°], are promising technologies for use in chemical sensing and high temperature sensing applications, respectively. The previous statement also applies to other LGS orientations and other crystals from the langasite family, such as langatate (LGT) and langanite (LGN), as well as gallium orthophosphate. However, due to the properties of these substrate/electrode-metal combinations, conventional SAW resonator design techniques result in suboptimal frequency response characteristics such as Q-factor, insertion loss, and the rejection of spurious modes. Accordingly, it would be desirable to provide an improved surface acoustic wave resonator design.

One embodiment of the present invention that provides such an acoustic wave resonator comprises an open circuit grating that reduces the frequency response insertion loss of Pt resonators on ST-X quartz [0°, 132.75°, 0°] and Pt and Pt/Rh/$ZrO_2$ resonators on LGS [0°, 144°, 24°]. In addition, the open circuit grating shows higher electrode reflectivity than a short circuit grating for a quartz device, which allows the possibility of reducing device size and improving performance. Furthermore, scalar potential theory is utilized in the following to predict the location of spurious transverse waveguide modes in resonator frequency responses. These spurious signals are then suppressed by scaling the length of the transducers' active areas to filter higher-order transverse waveguide modes.

The two-port SAW resonators used in this example were fabricated in clean room facilities at the Laboratory for Surface Science and Technology (LASST) and tested in the Microwave Acoustics Material Laboratory at the University of Maine. Design attributes common to all resonators used in this example include: 4 µm fingers ($\lambda=16$ µm), nominal mark-to-space ratio of 1:1, 0.8 mm aperture ($W_0=55\lambda$), 40 finger pairs per IDT, and 500 fingers per grating, which are terminated by an additional 110 linearly apodized grating fingers.

The Pt-electrode resonators were fabricated on ST-X quartz [0° 132.75° 0°] and LGS [0°, 144°, 24°] using a Zr adhesion layer; the total bimetal thicknesses were 80 nm and 92.5 nm, respectively. Co-deposited Pt/Rh/$ZrO_2$-electrode resonators were fabricated on LGS [0°, 144°, 24°] using a Zr adhesion layer; the total metal thickness was 120 nm. For each of the three substrate/metal combinations, resonators were designed and fabricated with four variations in the length of the active area W, ranging from 21λ to 51λ.

As discussed above, acoustic energy leakage and transverse waveguide modes are dependent on the phase velocity discontinuity between regions R1 and R2 as shown in FIG. 3. The phase velocities in these regions, for the resonators considered for this example, are listed in Table I below. The free-surface velocities ($v_0$) were calculated from the material constants of the respective substrates. The velocities under the Pt and Pt/Rh/$ZrO_2$ full metalized films ($v_m$) and half-metalized gratings ($v_g$) were calculated with the aid of Finite Element Method/Boundary Element Method (FEM/BEM) analysis. Stiffness parameters for the co-deposited Pt/Rh/$ZrO_2$ thin film, used in the FEM/BEM analysis, were extracted using matrix method techniques from SAW delay line measurements.

TABLE I

SAW PHASE VELOCITIES

| | | Phase Velocity (m/s) | | |
|---|---|---|---|---|
| Substrate | Metal | $v_0$ | $v_g$ | $v_m$ |
| Quartz ST-X | 80 nm Pt | 3159.0 | 3100.6 | 3053.5 |
| LGS [0° 144° 24°] | 92.5 nm Pt | 2753.8 | 2728.0 | 2713.1 |
| LGS [0° 144° 24°] | 120 nm Pt/Rh/$ZrO_2$ | 2753.8 | 2736.8 | 2728.0 |

Figure 4:
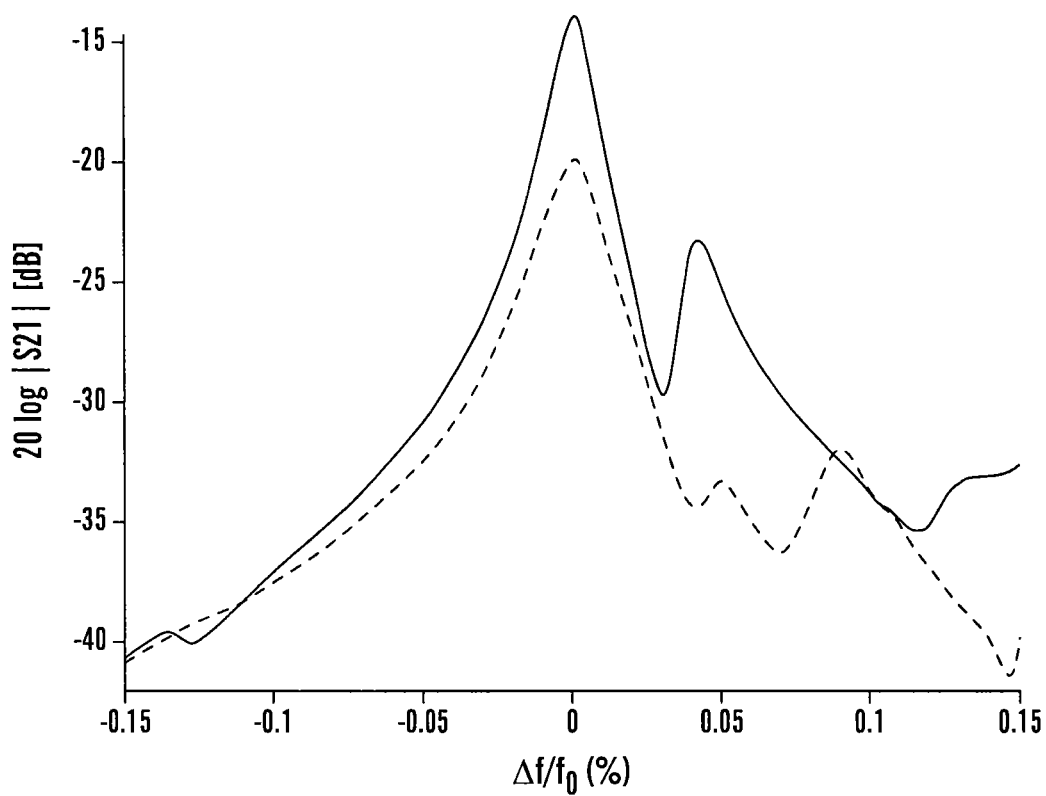
FIG. 4 shows a graph of the magnitude of the response of 80 nm Pt resonators on ST-X quartz with the black line representing open circuit gratings, $f_0=194.841$ MHz, $Q=8130$; and the dashed line representing short circuit gratings, $f_0=194.340$ MHz, $Q=4741$.

From Table I, it is evident that for the three substrate/metal combinations considered for this example, the relation: $v_m < v_g < v_0$ applies. Hence, if short circuit gratings are used, the SAW velocity in the metal bus bars (R2) is lower than that in the half-metalized grating (R1). Thus, acoustic energy leaked from the active area is confined within the bus bars, resulting in a resonator with increased insertion loss and reduced Q-factor. The dashed line in FIG. 4 is the frequency response of a Pt-electrode resonator on ST-X quartz, with a short circuit grating, $W_0=55\lambda$, and $W=51\lambda$. The solid line in FIG. 4 is the frequency response of a resonator of the same design, with the exception that open circuit gratings are utilized. As a result of the change from short circuit to open circuit gratings, the insertion loss is reduced by 6 dB and the Q-factor increased from 4741 to 8130. As previously discussed, the SAW energy under the open circuit grating region (R1) is bounded by the higher velocity free-surface region (R2), which traps the wave energy within the aperture of the resonator.

The inventors have also verified through FEM/BEM analysis that the reflection coefficient of a 500-element open circuit Pt grating is 9.8% greater than a SC grating on ST-X quartz. On LGS [0° 144° 24°], however, an open circuit Pt grating is only 0.6% less reflective than a short circuit grating. The higher reflectivity of the open circuit gratings on ST-X quartz provides the ability to reduce resonator device dimensions and improve performance.

The waveguide structure that was created by implementing open circuit gratings can support multiple transverse waveguide modes that appear as spurious signals in a resonator's frequency response. This is evidenced in FIG. 4 by the appearance of a peak at $\Delta f/f_0=0.042\%$.

Figure 5:
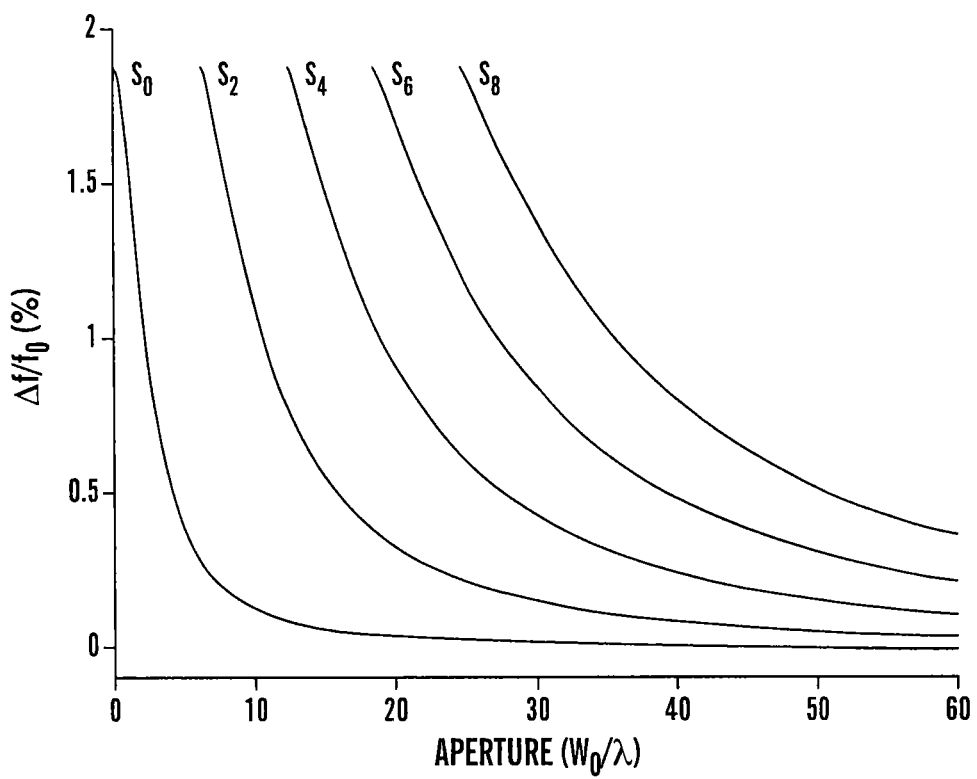
FIG. 5 illustrates a graph of the theoretical dispersion curves for an 80 nm Pt resonator on ST-X quartz with open circuit gratings.

Calculated using equation 1, the transverse waveguide dispersion curves for an 80 nm Pt resonator on ST-X quartz are shown in FIG. 5, plotted in terms of $\Delta f/f_0$ where $f_0$ is the frequency of the fundamental mode at $W_0=60\lambda$. At $W_0=55\lambda$, $S_2$, $S_4$, $S_6$, and $S_8$ are predicted at $\Delta f/f_0=0.042\%$, 0.13%, 0.256%, and 0.428%, respectively. Mode $S_2$ corresponds to the spurious peak in the response of the open circuit resonator in FIG. 4.

Figure 6:
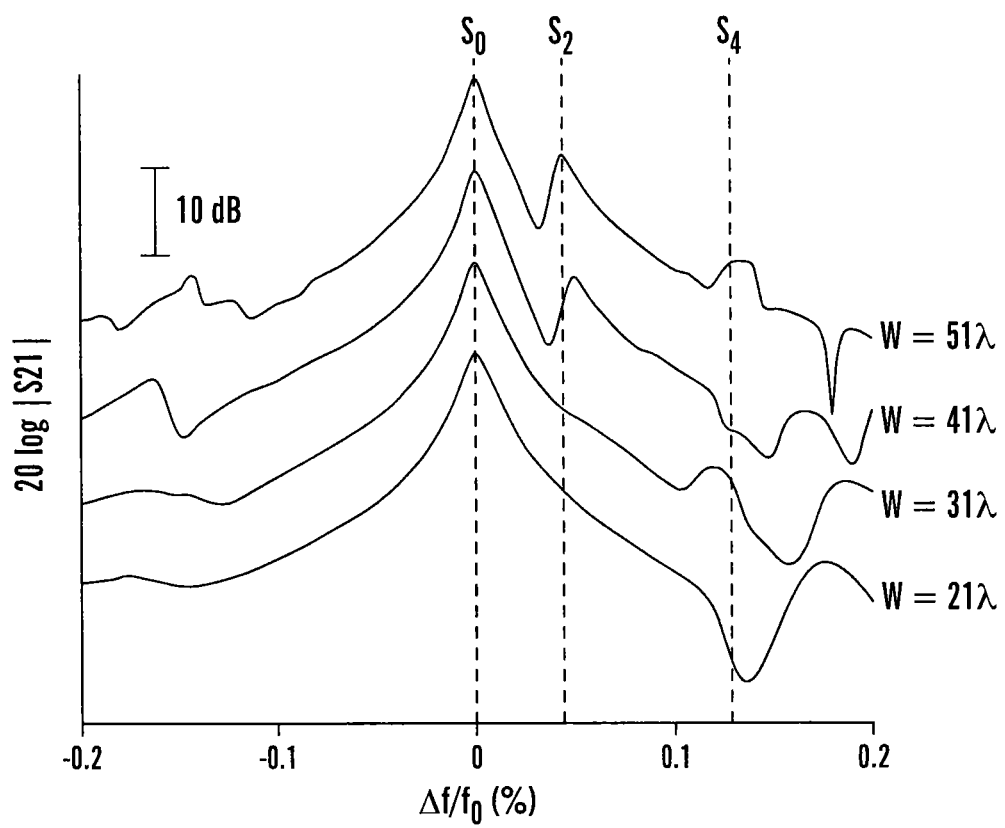
FIG. 6 shows a graph of magnitude responses of 80 nm Pt resonators on ST-X quartz with open circuit gratings, $W_0=55\lambda$. Top curve to bottom curve: $W=51\lambda, 41\lambda, 31\lambda, 21\lambda$. Absolute position on the ordinate is not preserved. Calculated dispersion from FIG. 2 at $W_0=55\lambda$, $S_0, S_2, S_4$: $\Delta f/f_0=0\%$, 0.042%, 0.013%.

FIG. 6 shows the resulting measured frequency responses of open circuit ST-X quartz SAW resonators when the size of the active area is varied from $W=51\lambda$ (top curve) to $W=21\lambda$, (bottom curve), while maintaining a constant aperture of $W_0=55\lambda$. Also indicated in FIG. 6 are the calculated locations of $S_0$, $S_2$, and $S_4$, determined from equation 1. As the active area is reduced, the intensity of waveguide mode $S_2$ is clearly diminished and is minimized for $W=26\lambda$, resulting in the data set's largest Q-factor of over 9200.

Figure 7:
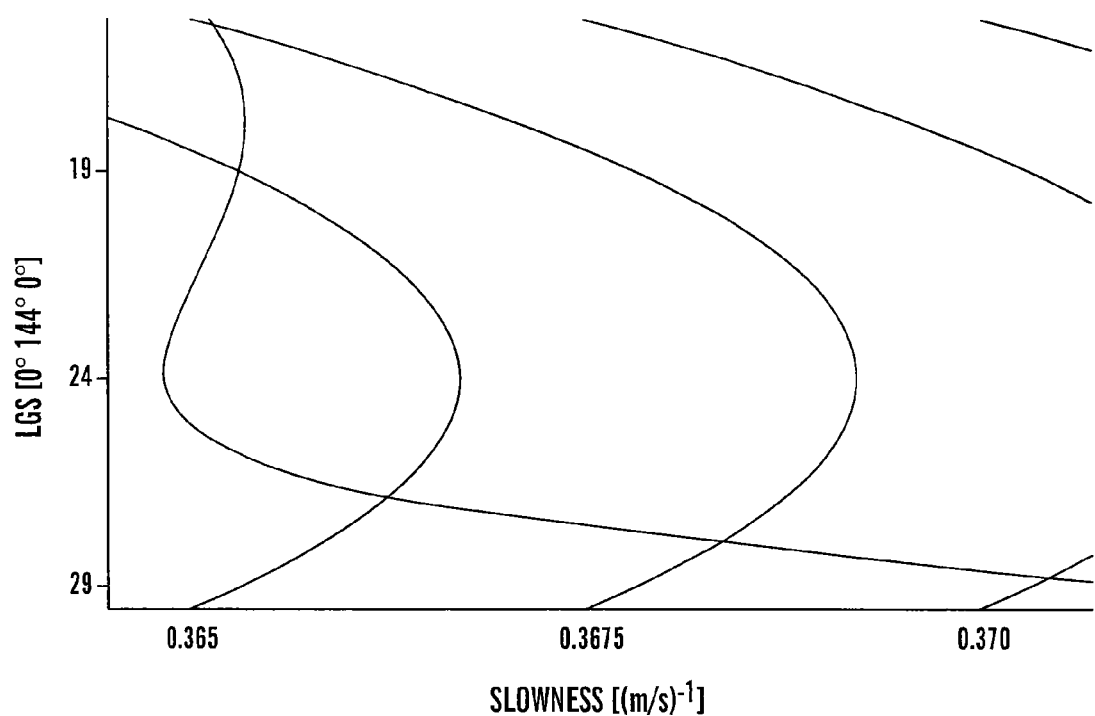
FIG. 7 is a graph showing a polar plot of free surface slowness for LGS [0°, 144°, θ].

The free-surface slowness for LGS [0°, 144°, θ] is plotted from $\theta=16°$ to 29° in FIG. 7. A local minima occurs at $\theta=24°$, indicating that spurious transverse waveguide modes will occur at frequencies lower than resonance. Although the parabolic approximation is not appropriate to determine the anisotropic factor α, around $\theta=24°$, due to the shape of the slowness curve, $\alpha=-0.6$ was empirically found to provide good agreement between the calculated dispersion curves for 92.5 nm Pt resonators on LGS [0°, 144°, 24°] as shown in FIG. 8, and the experimental frequency response for $W_0=55\lambda$, as shown in FIG. 9.

Figure 8:
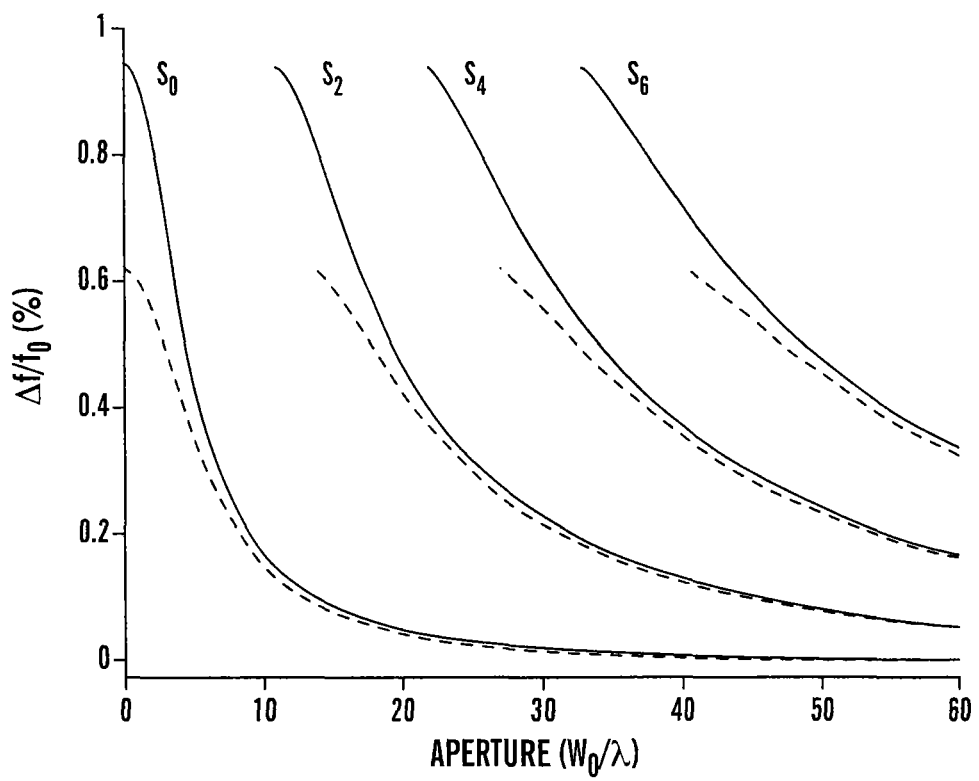
FIG. 8 illustrates a graph showing theoretical dispersion curves for resonators on LGS [0°, 144°, 24°]. The black lines represent 92.5 nm Pt electrodes while the dashed lines represent 120 nm Pt/Rh/ZrO$_2$ electrodes.

The calculated transverse waveguide dispersion curves for 92.5 nm Pt resonators and 120 nm Pt/Rh/ZrO$_2$ resonators on LGS [0°, 144°, 24°] are depicted in FIG. 8, for $\alpha=-1.2$. The cutoff region is reduced for the Pt/Rh/ZrO$_2$ resonators due to the smaller ratio, $v_0/v_g$. At $W_0=55\lambda$, the dispersion curves indicate that transverse waveguide modes $S_2$, $S_4$, and $S_6$ are supported at $|\Delta f/f_0|=0.067\%$, 0.200%, and 0.398%, respectively, for the Pt electrodes, and $|\Delta f/f_0|=0.065\%$, 0.195%, and 0.383%, respectively, for the Pt/Rh/ZrO$_2$ electrodes.

FIG. 9 shows the resulting frequency responses for 92.5 nm Pt resonators and 120 nm Pt/Rh/ZrO$_2$ resonators on LGS [0°, 144°, 24°]. The curves correspond to resonators in which the length of the active area is varied from $W=21\lambda$ (top curve) to $W=51\lambda$ (bottom curve), while maintaining a constant aperture of $W_0=55\lambda$. The calculated locations of $S_0$, $S_2$, and $S_4$ are also indicated. Modes higher than $S_4$ do not significantly affect the response. For the 92.5 nm Pt resonators in FIG. 9a, the resonator with the largest Q-factor ($W=21\lambda$) has extremely high presence of the spurious modes, $S_2$ and $S_4$, which are only 4 dBc and 0.6 dBc below $S_0$, respectively. However, when $W=31\lambda$, mode $S_2$ diminishes significantly, resulting in a Q-factor that is 35% improved compared to $W=51\lambda$. Additionally, the rejection of mode $S_4$ is 5.1 dBc, with respect to $S_0$, at $\Delta f/f_0=-0.18\%$. For the frequency response of the 120 nm Pt/Rh/ZrO$_2$ resonators, shown in FIG. 9b, spurious mode $S_2$ diminishes significantly when $W=41\lambda$. For $W=41\lambda$, the Q-factor is 6.8% better than that for $W=51\lambda$ and 22% better than that for $W=21\lambda$. For $W=41\lambda$, the rejection of mode $S_4$ is 6.9 dBc, with respect to $S_0$, at $\Delta f/f_0=-0.2\%$. FIG. 9 suggests that an interference, other than transverse waveguide, is responsible for the spurious peaks occurring at $\Delta f/f_0=-0.14\%$.

From the above, it is clear that replacing the short circuit gratings of a Pt-electrode resonator on ST-X quartz with open circuit gratings decreased the insertion loss by 6 dB and increased the Q-factor by 56%. Dispersion relations for Pt resonators on ST-X quartz as well as Pt and Pt/Rh/ZrO$_2$ resonators on LGS [0°, 144°, 24°] were used to calculate the locations of spurious waveguide modes in the resonators' frequency responses. These results were graphically shown to align with the resonators' measured responses. Additionally, suppression of the transverse waveguide modes was accomplished by adjusting the length of the active area, such that higher order modes were filtered by the IDTs.

FIGS. 1 and 2 depict short and open circuited grating resonators, respectively. For operation at high temperatures, platinum alloy thin films may be utilized for the electrodes. These electrodes are deposited on top of a piezoelectric substrate capable of high temperature operation, such as the LGX family of crystals and GaPO$_4$, for the generation, detection, and reflection of surface acoustic waves. The electrode geometry of the prior art short circuited grating resonators, as shown in FIG. 1, is such that they trap acoustic energy and generate several spurious responses in the frequency response, thus seriously compromising the device performance as a frequency control component and sensor. In particular, when the surrounding temperature is varied, the existence of such spurious modes interfere with the major mode to be tracked, thus rendering the sensing mechanism and/or frequency tracking ineffective, since the tracking can jump between two or more distinct modes with different temperature behaviors.

The bus bar, necessary to short circuit the grating electrodes in the short circuited grating resonator, is not necessary for the operation of the open circuited grating resonator shown in FIG. 2. The removal of the bus bar for the high temperature operation of SAW devices as contemplated by the present invention results in, inter alia, the following fundamental benefits:

(1) diminished losses in the device, since the absence of a bus bar avoids energy trapping and scattering in the bus bar region;

(2) elimination of spurious modes related to the existence of the bus bar; and (3) increased quality factor, Q, of the resonator due to the diminished device loss as mentioned in item (1) above, and the elimination of spurious modes as mentioned in item (2) above.

Open circuited grating resonators of the present invention also permit the filtering of spurious transverse waveguide modes, without the need of a bus bar, as required in the short circuited resonator case.

With regard to advantages and improvements over prior art devices, the open circuited grating resonators of the present invention are superior in the generation of the latest versions of high temperature sensors for harsh environment applications and gas sensor applications due, at least in part, to the cleaner frequency response necessary to fix the operation and performance of these devices. Prior art short circuited grating resonators have severe limitations due to the generation of spurious resonant modes which distort the device frequency response. Under temperature variations, the interference of spurious modes render the frequency tracking of a sensor device or frequency control device ineffective due to mode distortion or even mode hopping.

It is envisioned that the newly designed and fabricated open circuited, grating resonators may be extensively used as high temperature surface acoustic wave wireless sensors, where high temperature is considered to be generally within the range of 300° C. to 1300° C. However, it is also contemplated the present invention also may be utilized for temperatures outside of this range. These devices can operate wirelessly as high temperature, pressure, strain, and corrosion sensors. One suitable wireless interrogation system is described in provisional patent application No. 61/311,968, filed on Mar. 9, 2010, the content of which is included herein by reference. In addition, the inventors have utilized open circuited grating resonators for the detection of fluorinated compounds with the devices being considered either as standalone fluorinated compounds sensors, or for integration with microhotplates, for improved sensing performance.

Aspects of the invention are suitable for integration into a variety of devices for various applications including high temperature sensors, pressure sensors, strain sensors, corrosion sensors, and wireless operating systems.

Other aspects of the invention may be used in biological applications. The principles and resonator design would be the same as described above, with gold or a gold alloy being a preferred material for the electrodes of the grating resonator. The presence of a liquid environment as opposed to a gaseous environment does not alter the utility of the present invention or the functioning of aspects of the present device. The difference in medium may merely impact the specific design of the SAW resonator, including potentially metal thickness used, desirable mark-to-space ration of the electrodes, and number, strength and arrangement of the IDT or IDTs. In addition, the use of the present invention in a liquid medium may potentially impact the optimal or desired orientation of the substrate. Two non-limiting examples of this would be for quartz ST-90 and LGS, wherein a general orientation for both substrates may be expressed as (0, θ, 90), wherein θ may be 132.75 for quartz ST-90 and θ may be 22 for LGS.

While several aspects of the present invention have been described and depicted herein, alternative aspects may be effected by those skilled in the art to accomplish the same objectives. Accordingly, it is intended to cover all such alternative aspects as fall within the true spirit and scope of the invention.

The invention claimed is:

1. A surface acoustic wave resonator for use in high temperature applications comprising:
   a piezoelectric substrate;
   at least one interdigital transducer supported by the piezoelectric substrate; and
   one or more grating reflectors supported by the piezoelectric substrate, the grating reflector being fabricated of a heavy metal and comprising a plurality of electrodes, at least one electrode of the plurality of electrodes being electrically isolated from at least one other electrode of the plurality of electrodes,
   wherein the at least one interdigital transducer, upon excitation, generates one or more surface acoustic wave and receives one or more reflected surface acoustic wave corresponding to the one or more surface acoustic wave having been reflected from the one or more grating reflectors, and wherein the interdigital transducer operates in conjunction with one or more grating reflectors to filter out one or more spurious transverse modes associated with the reflection of the surface acoustic wave with the one or more grating reflectors.

2. The surface acoustic wave resonator of claim 1, wherein each electrode of the plurality of electrodes is electrically isolated from each other electrode of the plurality of electrodes.

3. The surface acoustic wave resonator of claim 1, wherein the grating reflector is applied to the piezoelectric substrate as a series of conductive lines spaced in opposing relation.

4. The surface acoustic wave resonator of claim 1, wherein two grating reflectors are applied to the piezoelectric substrate, and wherein each grating reflector comprises a series of conductive lines spaced in opposing relation, and wherein at least one interdigital transducer is arranged between the two series of conductive lines spaced in opposing relation.

5. The surface acoustic wave resonator of claim 1, wherein the electrodes have a mark-to-space ratio between 30/70 and 70/30.

6. The surface acoustic wave resonator of claim 1, wherein the electrodes have a mark-to-space ratio between 40/60 and 60/40.

7. The surface acoustic wave resonator of claim 1, wherein said grating reflector is selected from the group substantially consisting of platinum, a platinum alloy, gold, and a gold alloy.

8. The surface acoustic wave resonator of claim 1, wherein said piezoelectric substrate is selected from the group consisting of ST-X quartz, langasite, langatate, langanite, barium titanate, lithium niobate, lithium tantalate, lithium tetraborate, sodium tungstate, and gallium orthophosphate.

9. The surface acoustic wave resonator of claim 1, wherein there are two interdigital transducers.

10. The surface acoustic wave resonator of claim 1, wherein the resonator is operative at temperatures between about 300° C. and about 1,300° C.

11. A method of manufacturing an acoustic wave resonator for use in high temperature applications, the method comprising
   providing a piezoelectric substrate;
   associating at least one interdigital transducer with the piezoelectric substrate; and
   providing one or more grating reflectors that are supported by the piezoelectric substrate, the grating reflector being fabricated of a heavy metal and comprising a plurality of electrodes, at least one electrode of the plurality of electrodes being electrically isolated from at least one other electrode of the plurality of electrodes,
   wherein the at least one interdigital transducer, upon excitation, generates one or more surface acoustic wave and receives one or more reflected surface acoustic wave corresponding to the one or more surface acoustic wave having been reflected from the one or more grating reflectors, and wherein the interdigital transducer operates in conjunction with one or more grating reflectors to filter out one or more spurious transverse modes associated with the reflection of the surface acoustic wave with the one or more grating reflectors.

12. The method of claim 11, wherein each of the plurality of electrodes are electrically isolated from each other.

13. The method of claim 11, wherein the grating reflector is applied to the piezoelectric substrate as a series of conductive lines spaced in opposing relation.

14. The method of claim 11, wherein two grating reflectors are applied to the piezoelectric substrate, and wherein each grating reflector comprises a series of conductive lines spaced in opposing relation, and wherein at least one interdigital transducer is arranged between the two series of conductive lines spaced in opposing relation.

15. The method of claim 11, wherein the electrodes have a mark-to-space ratio between 30/70 and 70/30.

16. The method of claim 11, wherein the electrodes have a mark-to-space ratio between 40/60 and 60/40.

17. The method of claim 11, wherein said grating reflector is selected from the group substantially consisting of platinum, a platinum alloy, gold, and a gold alloy.

18. The method of claim 11, wherein said piezoelectric substrate is selected from the group consisting of ST-X quartz, langasite, langatate, langanite, barium titanate, lithium niobate, lithium tantalate, lithium tetraborate, sodium tungstate, and gallium orthophosphate.

19. The method of claim 11, wherein there are two interdigital transducers.

20. The method of claim 11, wherein the resonator is operative at temperatures between about 300° C. and about 1,300° C.

21. The surface acoustic wave transducer of claim 1, wherein the at least one interdigital transducer forms one or more apertures, and wherein the one of more apertures has a range of $21\lambda$ to $51\lambda$, wherein $\lambda$ is the wavelength of the surface acoustic wave.

22. The surface acoustic wave transducer of claim 2, wherein the filtered spurious mode corresponds to the second fundamental resonant mode (m=2).

* * * * *